United States Patent [19]

Walters et al.

[11] Patent Number: 5,434,502
[45] Date of Patent: Jul. 18, 1995

[54] CALIBRATION DEVICE FOR HYPER-FREQUENCY ADJUSTMENT OF THE REFERENCE PLANES OF AN APPARATUS FOR MEASURING THE DISPERSION PARAMETERS OF ELEMENTS OF INTEGRATED CIRCUITS

[75] Inventors: Peter C. Walters, Bowen Island, Canada; Patrice Gamand, Yerres, France

[73] Assignee: U.S. Philips Corporation, New York, N.Y.

[21] Appl. No.: 124,742

[22] Filed: Sep. 21, 1993

[30] Foreign Application Priority Data

Sep. 23, 1992 [FR] France ................. 92 11332

[51] Int. Cl.6 ............... G01R 35/00; G01R 31/02
[52] U.S. Cl. ........................... 324/158.1; 324/754
[58] Field of Search ............. 324/158 R, 716, 158.1, 324/74, 95, 754, 763

[56] References Cited

U.S. PATENT DOCUMENTS 4,144,493  3/1979  Lee et al. ............. 324/158 R
4,347,479  8/1982  Cullet .................. 324/716
5,247,262  9/1993  Cresswell et al. ..... 324/716

FOREIGN PATENT DOCUMENTS 3243871  2/1990  Japan .

Primary Examiner—Ernest F. Karlsen
Attorney, Agent, or Firm—Robert J. Kraus

[57] ABSTRACT

A calibration device is disclosed for hyper-frequency adjustment of the reference planes of an apparatus for measuring the dispersion parameters of elements of circuits integrated on a substrate. The device includes, integrated on the same substrate, standard patterns and accesses to these patterns which are compatible with the contacts of two test probes connected to the apparatus. Also provided on the substrate are at least two identical series of standard patterns which are formed by parallel lines of the same length, including a short-circuit line and/or an open line and/or a load line, whose accesses are aligned within each series, but opposed from one series to another with respect to the zone in which the second ends are situated. Their second ends are aligned within each series, defining the facing reference planes, separated by a given distance d. The second ends are also arranged in an offset manner from one series to the other in the plane of the substrate by translations parallel to the reference planes so that the distance between these offset ends is equal to or greater than twice the thickness of the substrate and the distance d separating the reference planes is approximately equal to or smaller than three times the thickness of the substrate.

18 Claims, 7 Drawing Sheets

CALIBRATION DEVICE FOR HYPER-FREQUENCY ADJUSTMENT OF THE REFERENCE PLANES OF AN APPARATUS FOR MEASURING THE DISPERSION PARAMETERS OF ELEMENTS OF INTEGRATED CIRCUITS

BACKGROUND OF THE INVENTION

1. Field of the Invention

The invention relates to a calibration device for hyper-frequency adjustment of the reference planes of an apparatus for measuring the dispersion parameters of elements of circuits integrated on a substrate, which device comprises, integrated on the same substrate, standard patterns and accesses to these patterns which are compatible with the contacts of two test probes connected to the apparatus.

The invention is used for monolithic integrated circuit technology components (MMIC) operating at hyper-frequencies of between 40 and 80 GHz, for example around 60 GHz, and of the so-called microstrip type.

Microstrip technology is to be understood to mean a type of technology where the integrated circuits are realised on a substrate, a first surface of which receives the circuit itself, comprising active and passive elements, including the transmission lines formed by microstrip conductors, and the second surface of which receives a ground layer. According to this technology, the value of the impedances is linked on the one hand to the physical dimensions of the strips and on the other hand to the thickness of the substrate separating the strip from the ground layer. Moreover, the connection of the ground leads, or ground points, of the first surface to the ground layer on the second surface is realised by way of plated-through holes which are also referred to as via holes. This technology is particularly attractive for the realisation of hyper-frequency integrated circuits operating, for example around 60 GHz or between 40 and 80 GHz, with a very high integration density.

This technology is to be distinguished from the technology which is referred to as the coplanar technology where the integrated circuits occupy only a single surface of a substrate. In that case the hyper-frequency transmission lines are realised by means of two metallic strips which are arranged in parallel in the single plane of the substrate. The value of the impedances is then linked to the dimensions of one of the metallic strips constituting the conductor and the distance separating the latter from the other strip which is connected to ground. In the coplanar technology, the lines can also be formed by a conductor realised between two ground strips. This technology, involving conductors and ground on one and the same surface of the substrate, requires a large surface area and hence is not very suitable for large scale integration.

Therefore, designers of integrated circuits nowadays prefer the microstrip technology for realising hyper-frequency Monolithic Microwave Integrated Circuits (MMICs).

2. Description of the Related Art

From Japanese Patent JP-3243871 of Feb. 21, 1990, it is already known to realise a device for testing a field-effect transistor in order to establish data bases with its hyper-frequency characteristics which can be used for the implementation of devices in microstrip technology.

To this end, the cited document describes a device (shown in FIG. 1a) with a substrate 201 which comprises a first circuit part 202 and a second circuit part 203 which are realised on a surface of the substrate which is referred to as the upper surface.

In the first circuit part 202 there is formed the field effect transistor 204 to be tested, comprising an input zone with a gate G, a ground zone 211 which is connected to the source electrode S, and an output zone which comprises a drain D. The input and output zones comprise transmission lines 205 and 206 and plated-through holes 215 which are connected to the ground layer on the lower surface of the substrate. The assembly formed by a line end situated between two plated-through holes will be referred to as hereinafter as "access". The input and output accesses of the transistor 204 to be tested, therefore, are situated on the one hand in the zone 207 formed by the end 214 of the line 205 and the plated-through holes 215, and on the other hand in a symmetrical zone 208 which is formed by the end of the line 206 and the two other plated-through holes. The accesses are thus symmetrically arranged on the upper surface of the substrate, at opposite edges thereof, each access comprising ground-conductor-ground.

In the second circuit part 203 there is implemented a calibration structure which comprises:

- two open line portions 220 with respective accesses ground-conductor-ground 216 of the type described above, aligned with the accesses 207 and 208 of the transistor at the edges of the substrate;
- two load line portions 222 having accesses 218 of the same type which are aligned with the accesses 207, 208 of the transistor at the edges of the substrate, said lines, however, being symmetrically formed relative to one another. These load lines are formed by segments of microstrip lines having lengths equal to those of the open lines, each of their ends which are remote from those of the accesses comprising a resistance. These resistances are not connected to ground via their other end. The assembly thus constitutes open load lines and the value of the resistances cannot be determined with precision because of the configuration chosen. This part of the calibration structure, therefore, is symmetrical relative to an axis extending parallel to the edges of the substrate and substantially at the level of the gate G of the transistor and at the centre of the upper surface of the substrate.

This calibration structure also comprises a transmission line of 50 Ω, one of its accesses 219 (ground-conductor-ground) being situated at one of the edges of the substrate, its other access 223, being of the same type, not being situated at the other edge but in a zone within the upper surface of the substrate.

This calibration structure thus forms a system which is referred to as a SOLT system (Short, Open, Load, Thru) for on-wafer tests in microstrip technology. It offers the advantage of on-wafer testing, so that the known drawbacks of testing by means of off-wafer calibration structures are avoided.

It is to be noted that the designer of these circuits is confronted by a technical problem concerning the formation of data bases for the different parts of hyper-frequency monolithic integrated circuits.

In order to reduce the cost of manufacturing hyper-frequency integrated circuits, it is necessary to automate their manufacture as much as possible and hence to perform the tests at the completion of assembly. It is desirable to apply test techniques which save the working time normally spent on these tests by a skilled person. This strategy implies that a priori full knowledge must be available concerning the hyper-frequency characteristics of each active or passive element occurring in the ultimate structures of the circuits, as well as knowledge as to how these parameters vary as a function of tolerances in respect of manufacture, polarization or disposition and proximity of these various elements in the circuits.

Generally speaking, the tests are performed by means of an apparatus which is referred to as an automatic vectorial analyser whose accesses are provided with probes connected by way of coaxial cables. The extremities of the probes are of the coplanar ground-conductor-ground type for a flat contact.

In order to use these probes during the tests, the patterns to be tested must have accesses which are also of the type ground-conductor-ground. To this end, as has already been stated, in a microstrip device it is necessary to collect the grounds on the upper surface of the substrate by utilizing pads which are connected to the lower surface, carrying the ground layer, via plated-through holes. Thus, a device constructed in microstrip technology can be tested by means of probes constructed in coplanar technology. This is the case, for example for the device cited as the state of the art.

Calibration of the measuring apparatus is an indispensable operation which consists in bringing the measuring reference layer, which would otherwise be at the level of the output/input accesses of the vectorial analyser, to the level of the inputs/outputs of the pattern being tested, for example a field effect transistor.

Therefore, a calibration structure should comprise patterns of known characteristics such as loads, short-circuits or lines, in order to establish, by calculation, which is the contribution of the measuring apparatus, of the coaxial connection cables, and of the probes themselves, introduced in the measurement of the reflection and transmission coefficients of the matrix S of the hyper-frequency characteristics of the elements of integrated circuits. Therefore, by measuring these coefficients for known patterns, this contribution can be eliminated by calculation (de-embedding), so that the elements of integrated circuits are tested with a high precision.

However, these measurements of the coefficients on known patterns must themselves be very exact. The precision of these preliminary or calibration measurements depends on several factors.

A first, very important factor resides in the quality of the contact of the extremities of coplanar probes with the accesses of the calibration patterns or the elements being tested. It has been found that the device cited as the state of the art exhibits shortcomings in this respect. In the known device, the contact of the probes cannot be checked. A non-detected poor contact could lead to random losses and noise in the measurements.

A second factor which is even more important resides in the reproducibility of the positioning of the extremities of the probe relative to the accesses of the calibration patterns or the elements being tested. In other words, any change in the coverage of the accesses of a pattern by the probe ends causes a change of the impedance and phase and/or module, and hence can cause substantial calibration errors by measurement of incorrect parameters S.

Such positioning errors appear notably when, in order to bring the probe ends into contact with the accesses of the calibration patterns, these probe ends must be displaced. The prior art device has exactly this drawback: the spacing of the probes must be changed so as to move the probes, for example from the short-circuit pattern 220 with the access 216 at the edge of the substrate to the thru pattern 223 with the access 219, one of which is situated at the centre of the surface of the substrate. Such displacements are the source of enormous errors in the measurements of the reflection and transmission coefficients and introduce notably substantial changes of phase which falsify the measurements and lead to very incorrect values of the components of the matrix S to be ultimately calculated.

A third factor resides in the calculation algorithm itself for determining the matrix S, which algorithm is linked to the number and the nature of the calibration patterns. The known device has the drawback that it utilizes an inaccurate algorithm. Actually, the nature of the calibration patterns leads to disturbed amplitude and phase responses of the transmission and reflection coefficients measured, as a function of the frequency, which thus lead to incorrect calculation of the matrix S.

The standard short-circuit (SHORT) exhibits notably an inductance to be measured. Moreover, the open-line standard (OPEN) shows a capacitance. As the frequency increases, the modelling of these standards SHORT and OPEN becomes more and more complex because of the parasitic capacitances and inductances. However, the line LOAD also exhibits a parasitic inductance and reflections which are dependent on the frequency. Moreover, the line THROUGH leads to a characteristic impedance which is not completely real but exhibits an imaginary part. This results in errors in the determination of the various coefficients ($S_{11}$, $S_{22}$, $S_{12}$, $S_{21}$) for the calculation of the matrix S which is the object of the calibration. Thus, when the known device is used, the calibration can be performed only within a narrow band and is limited in respect of frequency; therefore, it cannot be applied for frequencies as high as those in the range of from 40 to 80 GHz; this shortcoming is due to the poor definition of the standards.

A fourth factor resides in the positioning of the reference planes after calculations. As has already been stated, the calibration operation aims to bring the reference measuring planes at the level of the input/output zones of the device being tested, that is to say very near one another, for example at a distance of some tens of $\mu$m, typically from 50 to 80 $\mu$m in the case of a field effect transistor, which planes would otherwise be at the level of the output/input accesses of the vectorial analyser. This calibration operation aims to eliminate the contribution of the probes and the connections of all sorts, including the connections arriving at the element being tested. In the known device, this is not achieved because the reference planes after calculation are remote from the input/output zone of the transistor being tested: the distance between these planes is in the order of 250 $\mu$m; consequently, a part of the input/output connections of this transistor must be taken into account. This situation is a source of errors for the measurement of the characteristics of the transistor, because it necessitates the execution of supplementary calculations in order to eliminate the contribution of the connections between the reference planes obtained and the real input/output zones of the transistor.

This situation cannot be avoided in the known device. Actually, the position of the reference planes is, for example defined by the extremity of the open lines 220.

The latter lines being arranged opposite one another, there is a gap amounting to at least from two to three times the thickness of the substrate, or 250 μm, which gap cannot be reduced without giving rise to disturbances due to electromagnetic coupling. In the known device the same problem occurs because of the facing position of the loads 222. The position of the reference planes in the device, therefore, is a drawback because the operation for eliminating the external elements from the device being tested is incomplete.

A fifth factor resides in the arrangement of the patterns opposite one another. On the one hand, the calibration circuit comprising the patterns must be as compact as possible in order to reduce the costs, and on the other hand the parts of the patterns may not cause disturbances due to electromagnetic coupling.

In order to reduce the surface area occupied in the known device, the ground via holes of the various accesses are connected in common; the known device is thus rendered compact by saving one via hole out of every two. However, in this case one of the via holes at the end of the line 223, not being situated at the edge but at the centre of the substrate, becomes very close to the load pattern 222. This cannot be avoided because the line 223 is short and the structure is compressed by the common use of the via holes. Nevertheless, this arrangement represents a drawback because electromagnetic coupling occurs between the patterns 222 and 223 and hence calibration errors occur.

For the arrangement of the patterns opposite one another, it is also necessary to take into account the total number of patterns. The known device comprises 8 calibration patterns, which is a large number which evidently occupies a large surface area, resulting in increased costs.

A sixth factor resides in the method of using the calibration structure. It has already been stated that it is important to have available a device whose use involves alignment of the probes with both edges of the substrate. Subsequently, the probes can be lowered so as to apply them to the accesses of the calibration patterns, for each measurement it is only necessary to change the position of the substrate by translation which is exact in respect of magnitude and direction. It has also been stated that the known device does not allow for this type of use, but requires a change of the spacing of the probes at least for one measurement, i.e. that of the line (Thru), resulting in calibration errors.

In the method for using the known calibration device it also occurs that during the measurements relating to one probe, for example that which is positioned on the left-hand accesses, the other probe must be positioned either on the symmetrical accesses at the right or must remain suspended in the air (which is equivalent to an open line). In both cases the measurements are disturbed by electromagnetic coupling which is impossible to quantify. The known calibration structure thus has another drawback.

According to the present state of the art, a very large number of hyper-frequency circuits are realised according to the microstrip technology which is particularly suitable for operation at very high frequencies in the order of from 40 to 80 GHz and for obtaining a high integration density.

The calibration method is a method which contributes to obtaining an exact as possible characterization of the elements being tested. As the element being tested is destined to operate at a higher frequency, the more difficult the measurements will be; nevertheless, they still have to be exact.

SUMMARY OF THE INVENTION

It is an object of the invention to provide a calibration structure for testing elements or integrated circuits which are intended to operate in a range of high frequencies situated approximately between 40 and 80 GHz, and which are realised in microstrip technology.

When microstrip circuits are to be tested, it is necessary to take into account that the currently available probes are realised in a coplanar technology and must, therefore, be applied in contact with a single surface of the substrate of the circuit being tested. Thus, when such a measuring probe is applied to a microstrip circuit, a difficult coplanar/microstrip transition occurs. As has already been stated, this transition involves plated-through holes for return to ground via the substrate. A transition of this kind produces parasitic modes and these parasitic effects can be eliminated only by realizing the calibration structure in the same technology and on the same substrate as the element of the circuit being tested.

Therefore, it is important to adopt the concept of such a structure.

It is another object of the invention to provide a calibration structure for on-wafer testing of circuits constructed in microstrip technology, which structure itself is also realised in microstrip technology.

Therefore, it is an object of the invention to provide a calibration structure which produces results which are more exact than those supplied by the prior-art structure.

The invention notably aims to eliminate:
a) the poor positioning of the reference planes relative to the real input/output zones of the element of the integrated circuit being tested;
b) the poor positioning of the patterns relative to one another so that a saving of space is not achieved at the expense of errors due to undesirable coupling;
c) a poor method of using the calibration circuit due to non-optimum arrangement of the patterns;
d) the lack of perfection in the procedure for bringing the probes into contact with the accesses of the patterns or the elements being tested;
e) the lack of reproducibility in the latter procedure.

It is another object of the invention to eliminate the SOLT standard and use a calculation algorithm which is more exact.

It is another object of the invention to provide a calibration structure which:
is more compact
operates in a wider frequency band
at frequencies which are higher than in the known device.

In accordance with the invention, a calibration device as defined in the preamble is also characterized in that it comprises, provided on the substrate, at least two identical series of standard patterns which are formed by parallel lines of the same length, including:
a short-circuit line and/or an open line and/or a load line, whose accesses are aligned within each series but opposed from one series to another with respect to the zone in which the second ends are situated, their second ends being aligned within each series, defining said facing reference planes, separated by a given distance d, which second ends are also arranged in an offset manner from one series to the other in the plane of the substrate by translations parallel to the reference planes so that the distance between these offset ends is equal to or greater than twice the thickness of the substrate and the distance d separating the reference planes is approximately equal to or smaller than three times the thickness of the substrate.

A device of this kind offers inter alia the following advantage: because the ends of the lines are offset from one series of patterns to the next, it is achieved that these ends are situated at a distance from one another which suffices to ensure that the disturbing electromagnetic coupling is avoided, whereas the distance separating the reference planes can still be reduced. Thus, this distance can be chosen exactly as small as necessary, without being subject to technological restrictions. This distance can thus be chosen so that the reference planes are arranged to coincide exactly with the input/output zones of an element of the integrated circuit being tested. This advantage is extremely important because of the fact that the integratable hyper-frequency elements, notably the field effect transistors, exhibit distances between input/output zones which are very much smaller than the critical value amounting to from two to three times the thickness of the substrate. A high measurement precision is thus achieved, because these reference planes are positioned so that any involvement of elements outside the element being tested is indeed eliminated.

A specific embodiment of the device is characterized in that it also comprises a transmission line of a length such that its first and its second access are aligned relative to the accesses of the first and the second series of patterns, respectively.

The device then also offers the advantage that, during the calibration, the first probe will contact the accesses of the first series of patterns, or the first access of the transmission line which is aligned with the former accesses, whereas the second probe will contact the accesses of the second series of patterns, or the second access of the transmission line which is aligned with the accesses. Calibration can thus be realised without changing the spacing of the two probes between the contacting of the accesses of the series of patterns and the contacting of the accesses of the ends of the transmission line. The entire calibration procedure can thus be performed not only without changing the spacing of the probes between two tests, but also without moving the probes; actually, between each contacting of the accesses by the probes it suffices to impart a simple translation to the substrate, parallel to the axis of alignment of the accesses (or the reference planes). A high reproducibility of the measurements is thus obtained.

A specific embodiment of the device is characterized in that the first and the second series of patterns are arranged to both sides of the transmission line.

In this embodiment the calibration errors due to coupling, if any, are particularly well avoided because of the fact that the distances necessary between the patterns are very well respected. The calibration precision is, therefore, particularly high.

A specific embodiment of the device is characterized in that it comprises a first and a second contact strip, each of which is formed by a conductive strip provided so as to face the first and the second series of patterns, respectively, and aligned relative to the accesses of the second and those of the first series of patterns, respectively.

Thus, during the calibration procedure said first probe is successively brought into contact with the accesses of the first series of patterns, whereas said second probe is brought into contact with said first contact strip arranged so as to face the first series of patterns. Subsequently, the inverse procedure is carried out. When a probe is arranged on the contact strip, the latter corresponds to a short-circuit. The above procedure enables the quality and the reproducibility of the contact of the probes to be checked, and to eliminate non-quantifiable contributions and electromagnetic coupling. Actually, the measurement values may vary, depending on whether the probes are more or less in free contact with the metallic strips, and hence with the accesses. This eventuality is detected and eliminated. The unattractive use of open-circuit probes is also eliminated. Moreover, this attractive structure of the contact strips is realising without increasing the substrate area occupied by the device.

A specific embodiment of the device is characterized in that it comprises at least one first and at least one second marking strip which are arranged perpendicularly to the alignment axis of the access of the second and the alignment axis of the accesses of the first series of patterns, respectively, in order to mark the coverage of these accesses by the probes.

The advantage of this embodiment consists in that the coverage of the accesses by the probes can be measured with a high precision. Therefore, this coverage may be very reproducible. All, possibly very large errors, relating to the variation of coverage are thus avoided.

A specific embodiment of the device is characterized in that a marking strip is provided at least at one end of each of the contact strips.

This embodiment is particularly attractive for checking the coverage of the accesses as well as that of the contact strips, without taking up additional surface area. The measurements are, therefore, extremely reproducible, because the coverage is always fully known.

The above embodiments of the device may be characterized in that each of the two series comprises an open line and a load line, the latter line also being provided with a matching resistance which is connected to ground via its other end so that the device constitutes a calibration system according to the LRM standard, comprising a line, reflective elements and matched load elements.

In this case the calculation algorithm is extremely exact and still utilizes few patterns: only five patterns in comparison with the eight patterns in the prior art device. The structure of the device is, therefore, compact, less costly and more suitable for integration on a substrate, i.e. on the same substrate as the element to be tested. The matching load formed by the resistance connected to ground by way of its other end eliminates the reflections in the standard pattern formed by the load line. The calibration device is compatible with tests at very high frequencies as well as with very wide bands. All drawbacks inherent of the prior art SOLT standard are avoided.

An embodiment of the device is characterized in that the matching resistance is a specifically adjusted resistance, and/or is characterized in that the geometry of the resistance is appropriate to minimize the discontinuity with the line on the one hand and ground on the other hand whereto it is connected, for example characterized in that the geometry of the resistance is such that the latter has the same width as the line.

Tests have shown that the measurements are thus even further improved.

The above embodiments of the device may be characterized in that it is realised by means of the so-called microstrip technology, in that each access is formed by an end of a line situated between two plated-through holes spaced apart by the pitch of the ground-conductor-ground contacts of the probes, in that each pattern has a plated-through hole of an access in common with a plated-through hole of the access of an adjacent pattern, and in that the connections to ground in the device or the circuit being tested are realised via plated-through holes.

In that case the technology can operate at the very high frequencies required for carrying out the invention. It enables the implementation of large scale integrated circuits, and notably the calibration device is compact and not very complex.

An embodiment of the device is characterized in that, in said microstrip technology, the plated-through holes for return to ground through the substrate comprise pads having a hexagonal, circular or any other shape suitable for minimizing the discontinuity with the microstrip line connected thereto, said pads being provided on the surface carrying the accesses and being prolonged, if necessary, by means of a strip.

The discontinuities are thus avoided, as opposed to the prior art device in which the pads were square with a cross-section greater than that of the lines.

Therefore, the measurements are improved in accordance with the invention.

In the foregoing embodiments, the device can also be characterized in that in each series the length x of the lines is equal to or greater than $\lambda/4$.

Tests have shown that during operation disturbances with respect to the propagation in the TEM mode occur in microstrip-type circuits because of the return to ground through the substrate via the plated-through holes, which cause a disturbed transition at the level of the accesses. The length x of the lines is to be such that at the end of this distance the propagation has again been stabilized according to the TEM mode or quasi-TEM mode, that is to say at the level of the accesses as well as at the level of the reference planes. This arrangement thus enables elimination of these disturbances.

BRIEF DESCRIPTION OF THE DRAWING

The invention will be described in detail hereinafter with reference to the accompanying diagrammatic drawings figures; therein.

An apparatus for measuring parameters of the dispersion of elements of hyper-frequency integrated circuits comprises two probes which are connected to its input and output accesses. For an apparatus of this kind, for example an automatic vectorial analyser, contemporary probes are constructed using a technology which is referred to as a coplanar technology.

DESCRIPTION OF THE PREFERRED EMBODIMENTS

Figure 1A:
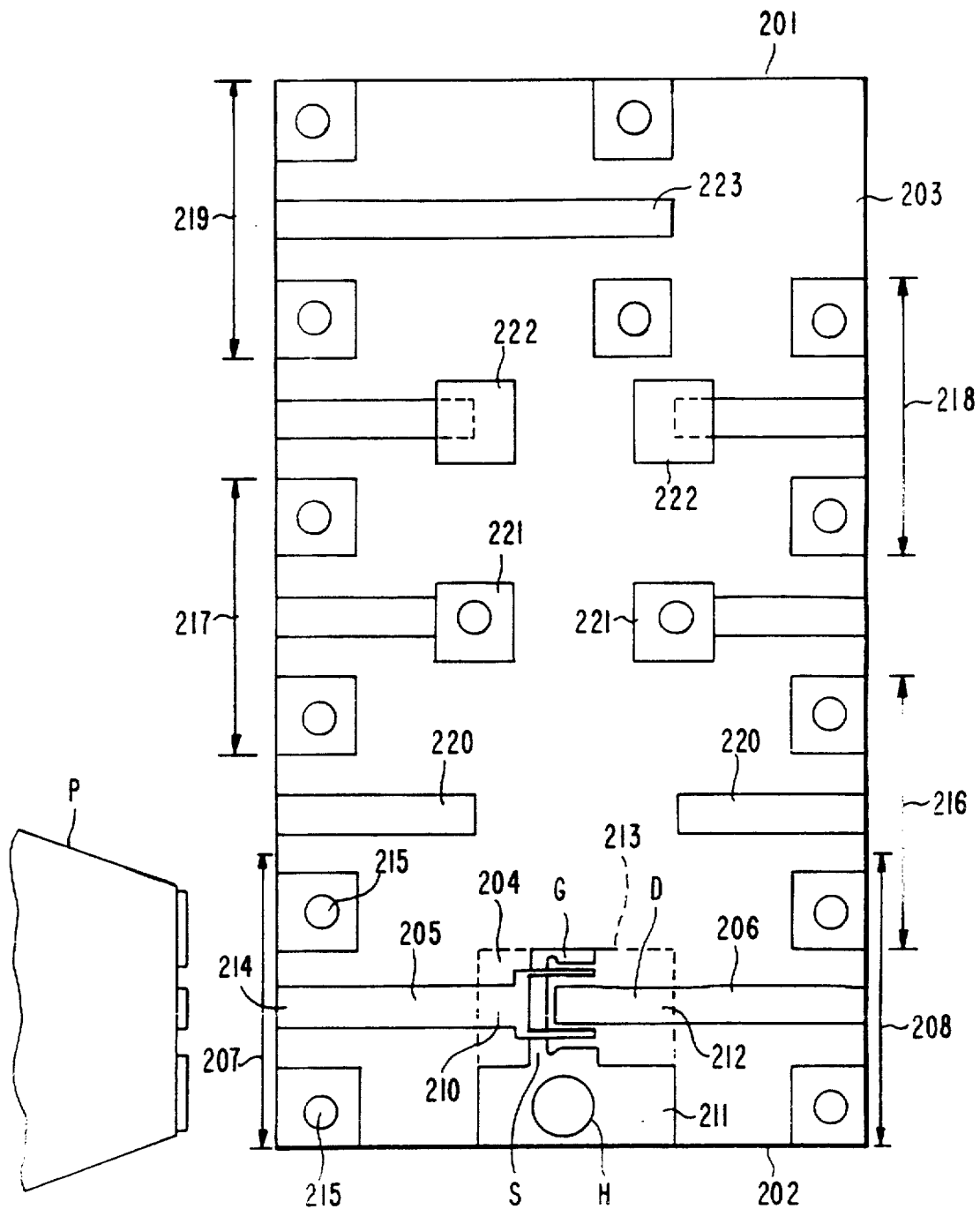
Figure 1B:
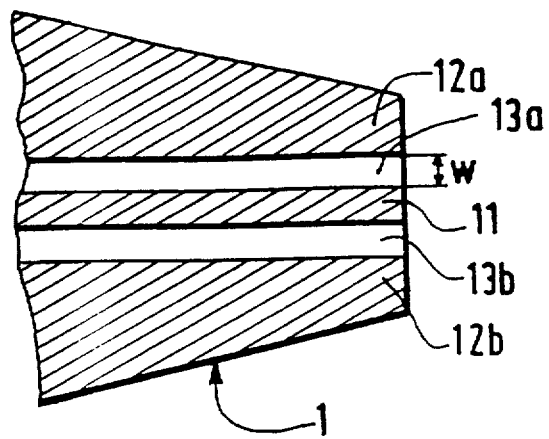

Referring to FIG. 1b, the probe ends comprise, formed on the same surface of a substrate 1, a central conductor which is formed by a metallic strip 11, and at least one metallic strip 12a which is connected to ground. Referring to FIG. 1b, the end of the probe may comprise a second metallic strip 12b which is connected to ground. The grounded strips 12a and 12b are separated from the central conductor 11 by spacers 13a and 13b having a width W approximately equal to the thickness of the substrate 1. The width of the conductor strip 11 is e. The impedance of the line formed by this arrangement depends on the width e of the conductor strip 11 and on the value W of the spacers 13a and 13b.

Figure 3:
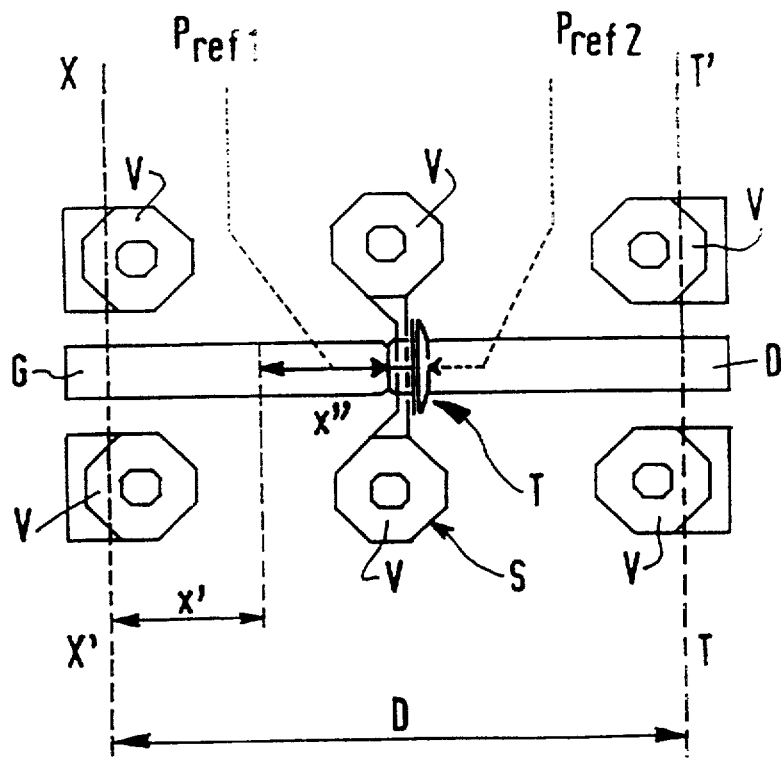
Figure 4A:
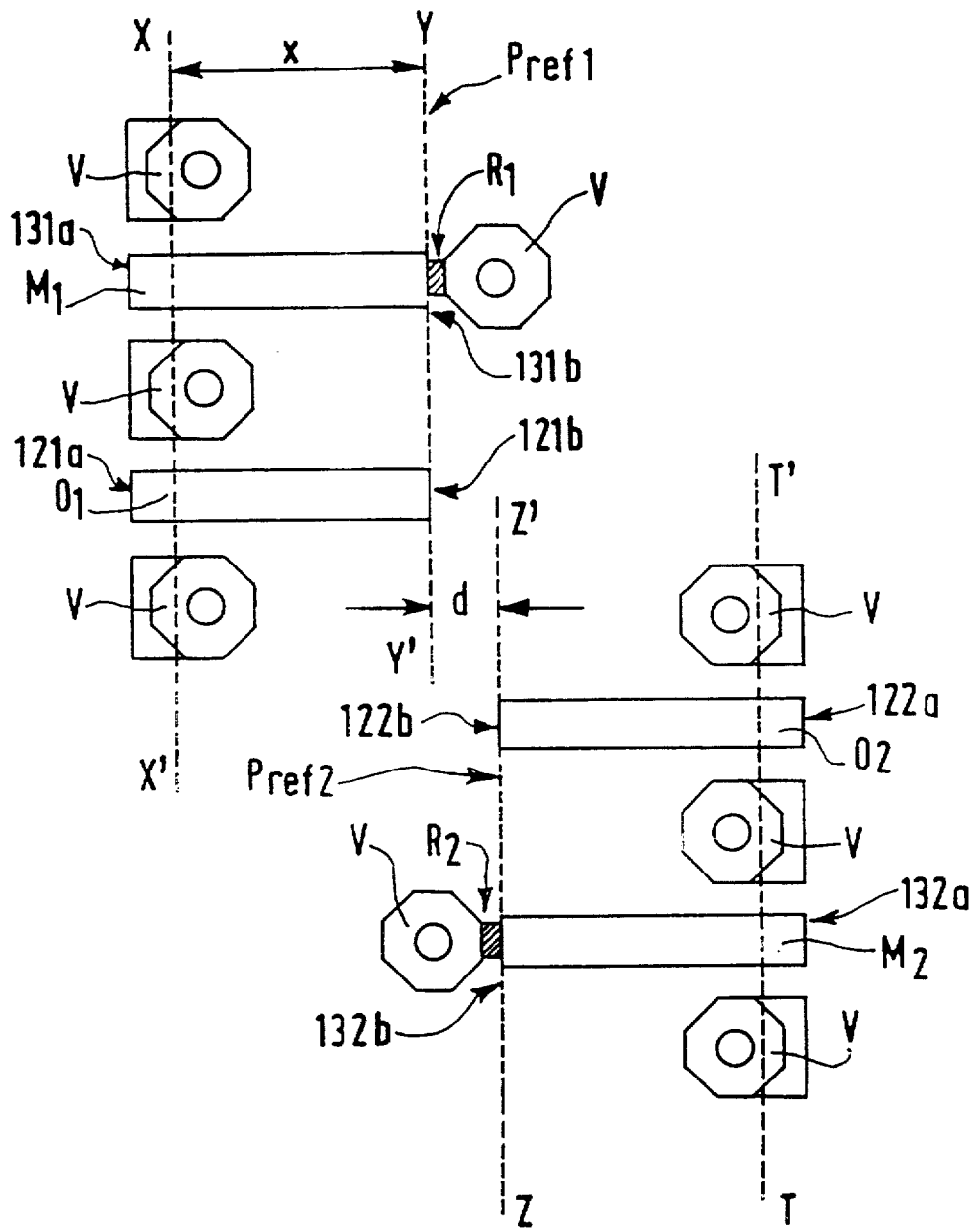
Figure 4B:
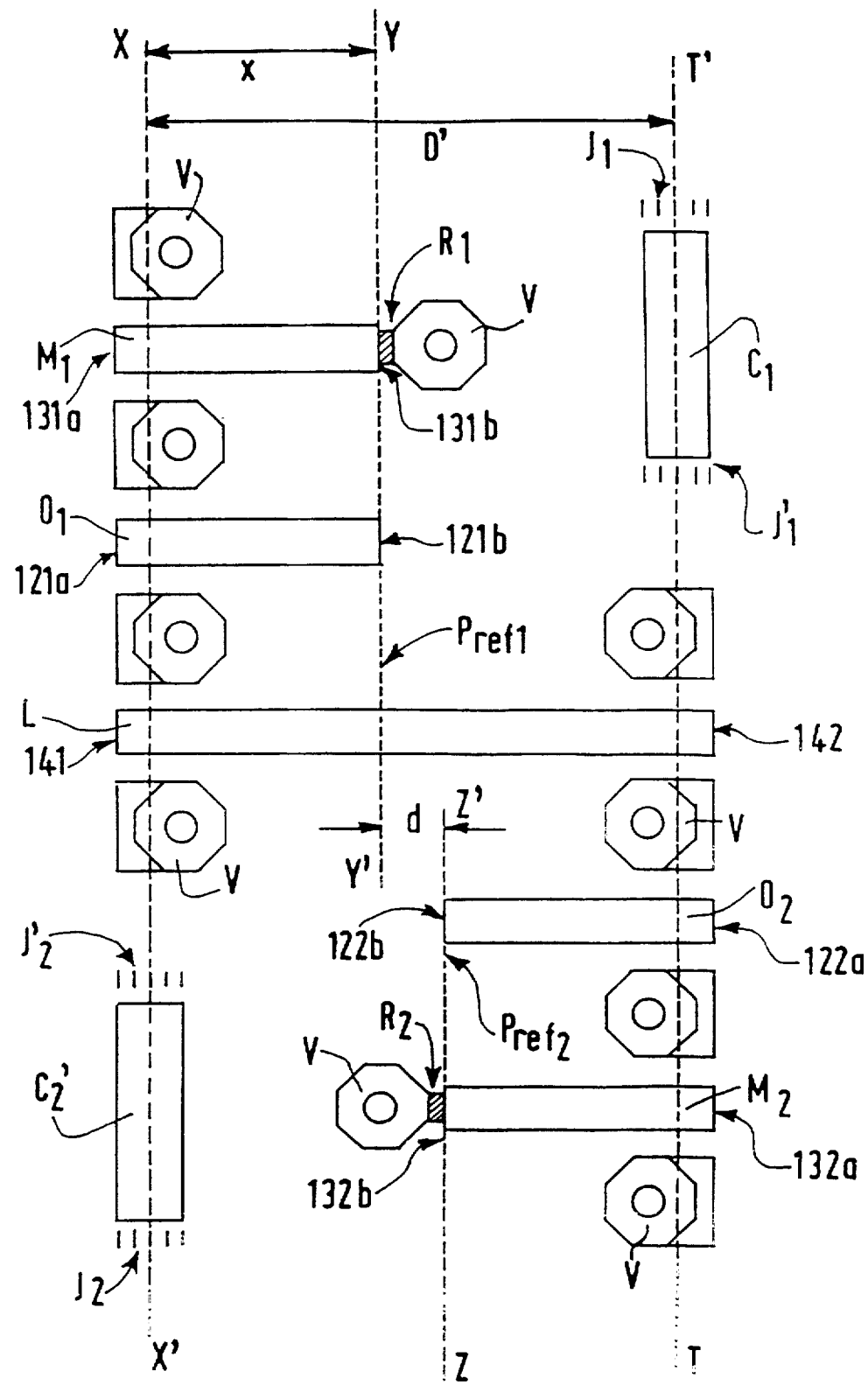

FIG. 3 shows, by way of a non-limitative example, a field effect transistor T. The transistor T comprises a gate, a drain and a source. The gate contact is extended by way of a conductor strip G, the drain contact being extended by a conductor strip D whereas the source contact is connected to ground by way of pads V.

The transistor T is realised using the so-called microstrip technology and is to be tested by means of the described vectorial analyser in order to determine the dispersion parameters $S_{11}$, $S_{22}$, $S_{12}$, $S_{21}$ and to calculate its matrix S.

Figure 1:
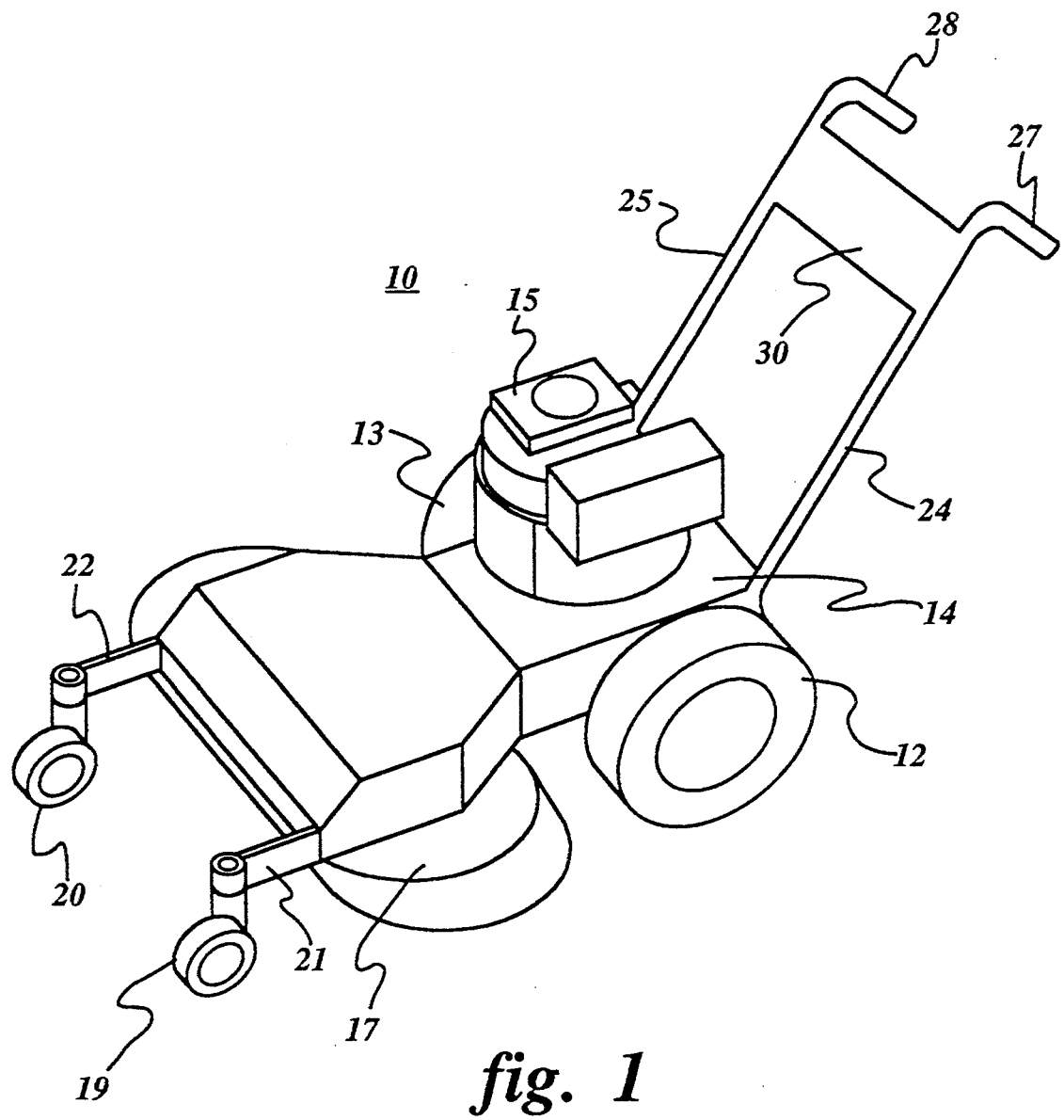
FIG. 1a shows a known testing device.
FIG. 1b is a plan view of a measuring probe.
Figure 2:
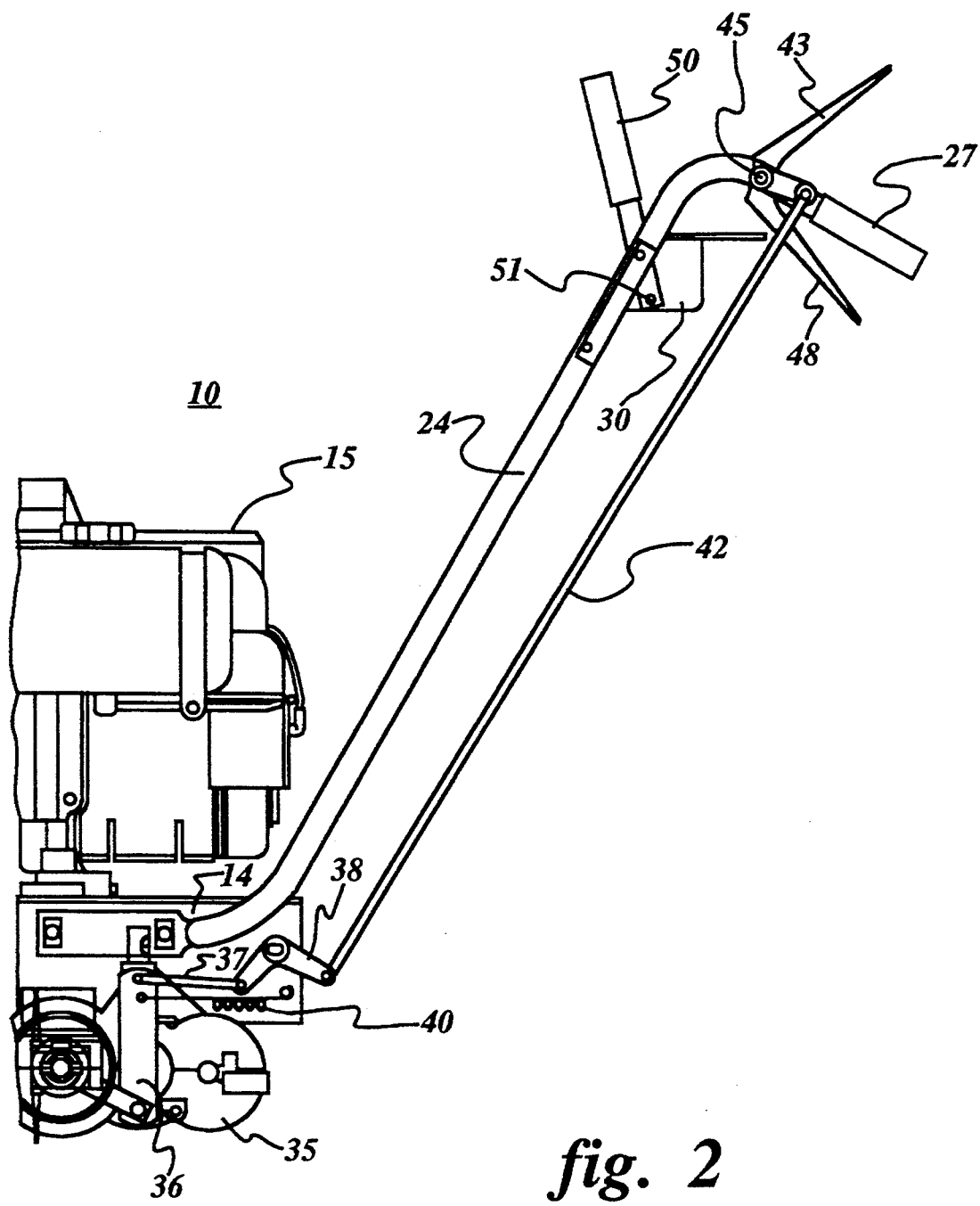
FIGS. 2a, 2b, 2c are plan views and sectional views of a microstrip line.
Figure 3A:
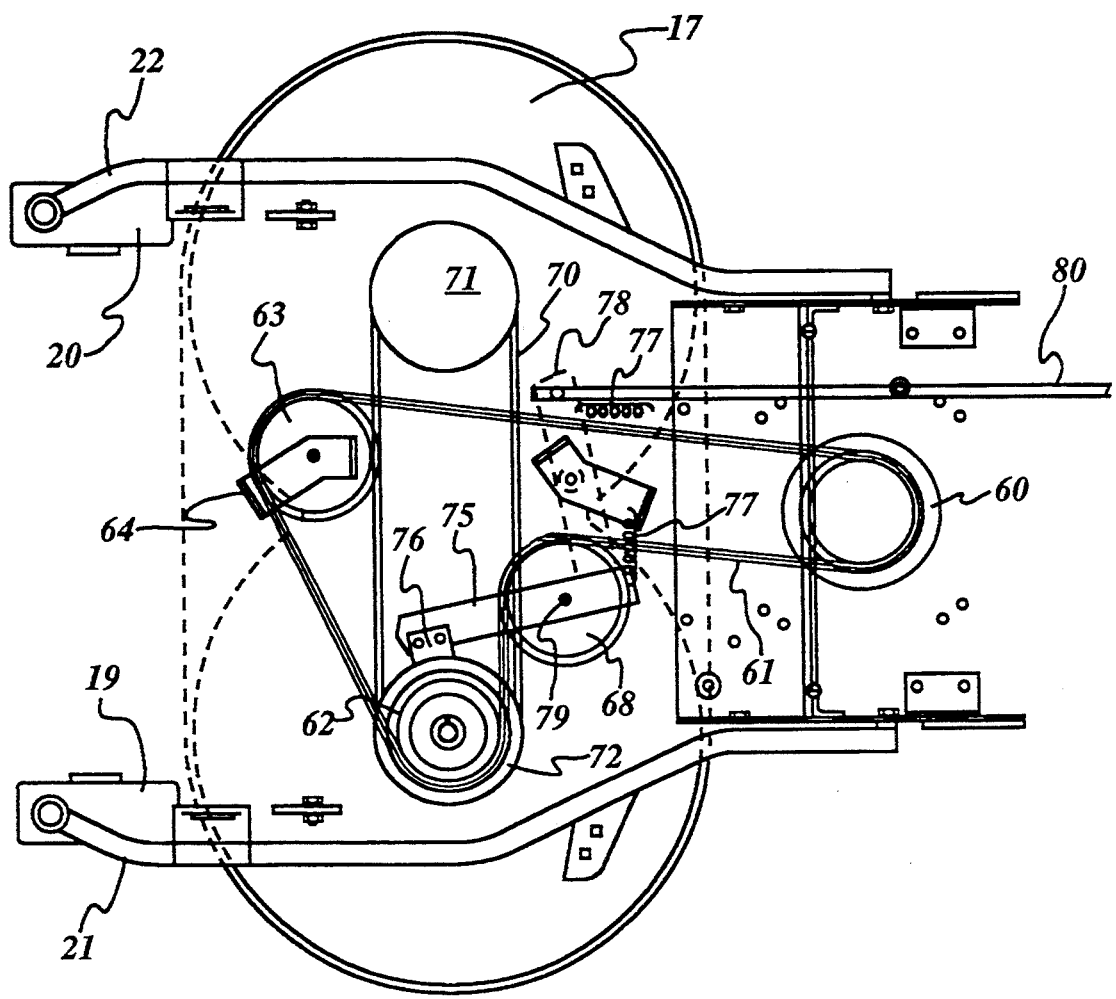
FIG. 3 shows an example of an element of an integrated circuit to be tested.
Figure 3B:
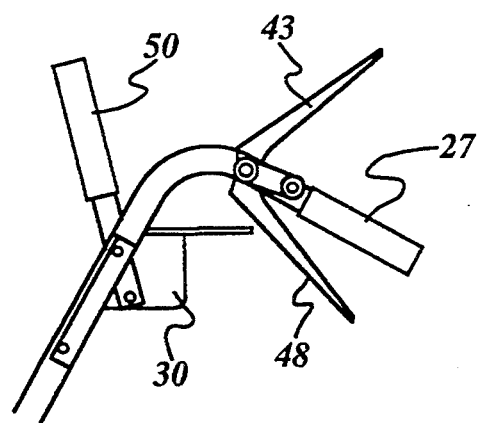

FIGS. 2 show a line formed by means of the microstrip technology and comprising on the one hand a conductor strip 21 formed on a first surface, referred to as the upper surface, of a substrate 2 and on the other hand a ground plane 25 which is formed on a second surface which is referred to as the lower surface of the substrate 2. The width of the metallic strip 21 is denoted by the reference e and the thickness of the substrate is denoted by the letter W. The impedance of the microstrip line depends on the width e of the metallic strip 21 and on the thickness W of the substrate. The microstrip line shown from above in FIG. 2a, is shown in a sectional view, taken along the line IIb—IIb, in FIG. 2b.

In order to realise the contact between the coplanar probe as shown in FIG. 1b and the microstrip line as shown in FIG. 2a, it is necessary to form ground contacts v. On the first or upper surface of the substrate 2 these ground contacts are realised by forming plated-through holes 24a, 24b which extend through the substrate 2 and which serve to apply the potential of the ground plane 25 to the ground pads 22a, 2b. The assembly of ground pads 22a, 22b and the plated-through holes 24a, 24b constitute the VIAS V.

In order to align the VIAS at the end of the lines 21 so as to achieve a better contact with the coplanar probes, the VIAS may be provided with segments of metallic strips 26a, 26b formed on said upper surface of the substrate 2 and extending, for example as far as the normal to the end of the line 21.

Thus, by using the line 21 and at least one plated-through hole V which is situated at the distance W from the line, an access to the line is formed which is compatible so as to form a contact with a coplanar probe. Preferably, a plated-through hole or via V is provided on both sides of the line 21 at the distance W. FIG. 2c is a sectional view, taken along the line IIc—IIc, of a via V as shown in FIG. 2a.

The transition formed between the coplanar probe and the microstrip line is a difficult transition which produces disturbances and hence measurement errors.

Again referring to FIG. 3, the transistor T being tested comprises a gate access which is formed by the end of the line G provided with two vias, arranged on both sides of this line, and a drain access which is formed by the end of the line D which is also provided with two vias V in the same arrangement.

Because of the disturbances caused by the coplanar/microstrip transition at the level of the line accesses at X'X and T'T, the propagation mode in the lines G and D could be disturbed up to a distance x', measured from these accesses, for example at X'X and T'T, which is approximately equal to from 2 to 3 times the thickness of the substrate, that is to say to approximately from 2 to 3 W. In order to stabilize the mode TEM, it is necessary to ensure that the length of the line between the access at X'X or at T'T and the input/output of the element being tested is greater than from 2 to 3 times the thickness of the substrate.

Therefore, the real input/outputs of the transistor being tested are arranged at a distance from X'X and T'T so that $x > x'$, for example $x = x' + x''$, in such a way that, between the gate and drain accesses and the input and output of the gate and the drain of the transistor being tested it may be assumed that the propagation mode is stabilized according to the TEM mode or quasi-TEM mode.

However, referring again to FIG. 3 and the foregoing description, the measurement of the dispersion parameters takes into account the imperfections of the system formed by the probe connections, the probes, the coplanar-microstrip transition and the lines G and D as far as the plane $P_{ref1}$ and $P_{ref2}$ situated at the level of the input/output of the transistor T being tested.

Therefore, it is necessary to eliminate the participation of these elements.

Figure 4A:
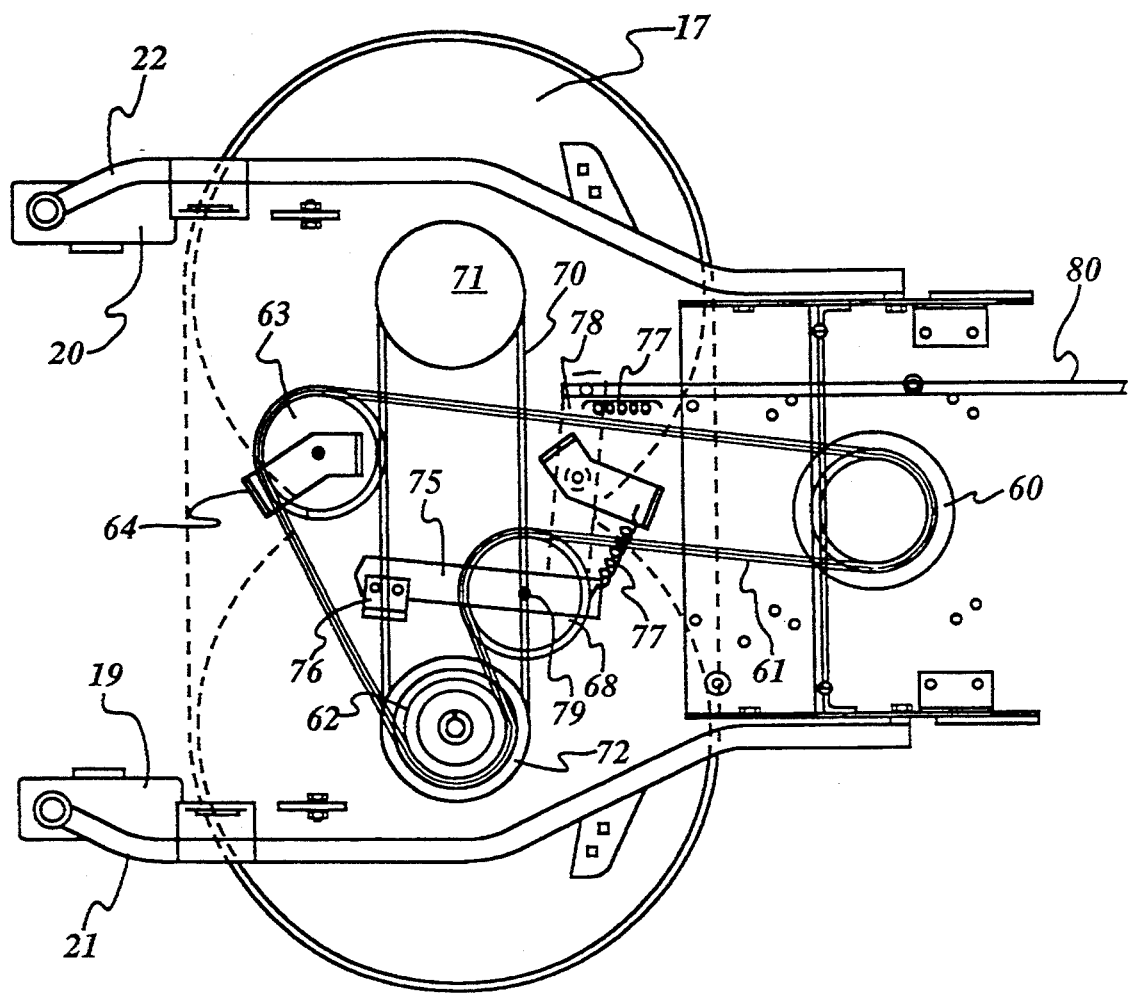
FIGS. 4a and 4b are plan views of a calibration device.
Figure 4B:
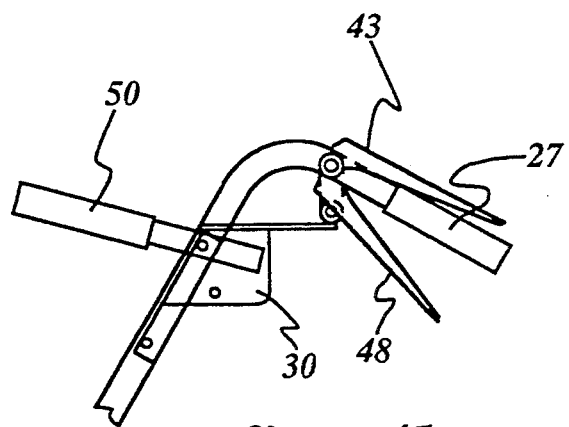

To this end, the invention proposes a calibration device, embodiments of which are shown in a plan view in the FIGS. 4a and 4b and enable the reference planes of the apparatus, which would otherwise be at the level of the input/output of this apparatus, to be positioned exactly in coincidence with the planes $P_{ref1}$ and $P_{ref2}$ at the level of the real input/output of the device being tested.

Preferably, the calibration device is formed on the same substrate and using the same technology as the device being tested, i.e. microstrip technology in the present case. It comprises accesses for the probe contacts which are realised according to the same structure.

Generally speaking, the calibration device comprises standard patterns and accesses to these patterns which are compatible with the test probes. The standard patterns are provided to enable measurement of dispersion parameters, enabling elimination (by calculation) of the participation of the elements of probes, various connections and transitions cited above.

The device in accordance with the invention proposes an arrangement of the standard patterns optimized so as to eliminate first of all the drawbacks relating to the structure as in the prior art device.

FIG. 4a is a plan view of a calibration device which comprises at least two identical series of standard patterns which are formed by parallel lines of the same length, including:

a short-circuit line and/or an open line and/or a load line, whose accesses are aligned within each series but opposed from one series to another with respect to the zone in which the second ends are situated, their second ends being aligned within each series, defining facing reference planes, separated by a given distance d, which second ends are also arranged in an offset manner from one series to the other in the plane of the substrate by translations parallel to the reference planes so that the distance between these offset ends is at least equal to two times, and preferably three times, the thickness of the substrate 2 and the distance d separating the reference planes is equal to or smaller than approximately three times the thickness of the substrate.

Thus, FIG. 4a shows a first series of patterns, comprising:

an open line $O_1$ with an end 121a provided with two vias V, arranged on both sides of this end and forming its access aligned with respect to an axis X'X, and a second end 121b at the distance x, defined previously, from the first end. The second end 121b of the open line $O_1$ is aligned with respect to the axis Y'Y which represents a reference plane $P_{rm}$ for the calibration system;

a load line $M_1$ of the same length as the open line $O_1$, having a first end 131a which is aligned with the first end 121a of the open line $O_1$, its access being aligned with that of the open line $O_1$ on the axis X'X, and a second end 131b, aligned with respect to Y'Y, which is also provided with a matching resistance $R_1$. The second end of the resistance $R_1$ is connected to ground by way of a via V, thus offering the advantage that the value of this resistance $R_1$ is fixed; this is not known from the state of the art.

In the document cited as the state of the art, the calibration device comprises a second series of patterns which are identical to those of a first series, each of which was arranged in the prolongation of one another so that the reference planes had to be separated from one another by a distance equal to twice, and preferably three times, the thickness of the substrate.

In accordance with the invention there is provided a second series of patterns, comprising an open line $O_2$ and a load line $M_2$ provided with a matching resistance $R_2$. The ends 122b and 132b of these lines, being aligned with respect to the axis Z'Z, define the second reference plane $P_{ref2}$ situated at the distance x from the accesses of these lines $O_2$ and $M_2$ which are aligned with respect to the axis T'T and which are formed by the ends 122a and 132a of these lines and vias V.

In accordance with the invention, the ends 122b and 132b of the lines do not face the ends 121b and 131b, respectively, but are offset by way of a translation parallel to the axes X'X and T'T. Thus, as appears from FIG. 4a, the distance d separating the axes Y'Y and Z'Z, symbolizing the reference planes $P_{ref1}$ and $P_{ref2}$, can be reduced while maintaining distances greater than the critical distance 3 W between the line elements, beyond which critical distance disturbances start to occur in the propagation due to the coupling between lines.

Thus, for the distance d between the reference planes $P_{ref1}$ and $P_{ref2}$ there can be obtained values as small as from 50 to 100 μm, enabling the planes $P_{ref1}$ and $P_{ref2}$ to coincide exactly with the real input/output zones of an integrated field effect transistor such as T shown in FIG. 3. According to the state of the art, it was not possible to drop below 3 W, generally being in the order of 250 μm, thus bringing the reference planes in a zone where the propagation is not stabilized according to the TEM mode or making the test and calibration circuits substantially large. In accordance with the invention, the test and calibration circuits become very compact and above all the participation of elements external of the device being tested is eliminated.

Referring to FIG. 4b, the calibration circuit also comprises a transmission line L.

During the calibration procedure, a first and a second coplanar probe are used to measure the dispersion parameters of the calibration circuit; to this end, these probes are successively applied to the accesses of the standard patterns, for example in alignment with the axis X'X for the first probe and in alignment with the axis T'T for the second probe.

In order to avoid the necessity of changing the spacing D between the two probes during the calibration procedure, the line L is provided with a first access at the side of its end 141, being aligned with the first axis X'X, and with a second access at the side of its second end 142 which is aligned with the second axis T'T.

Thus, during the calibration procedure the spacing D of the probes can be fixed and the substrate can be physically subjected, without changing the spacing from the beginning till the end of the procedure, to a translation parallel to the axes X'X and T'T by subjecting merely the probes to the movement necessary for bringing them into contact with the accesses. This procedure greatly improves the precision of measurement.

Referring to FIG. 4b, the first and the second series of patterns are preferably arranged to both sides of the transmission line L.

This optimized arrangement leaves two parts of the surface of the substrate free to receive first and second contact strips $C_1$ and $C_2$, each of which consists of a conductive strip arranged so as to face the first and the second series of patterns, respectively, and to be aligned with respect to the accesses of the second and the first series of patterns, respectively, that is to say with respect to the axes T'T and X'X, respectively.

During the calibration procedure, the non-used probe is brought into contact with the contact strip $C_1$ or $C_2$ facing the tested pattern $O_1$ or $O_2$, respectively. The contact strip short-circuits the pads ground-conductor-ground of the probe which it receives, thus improving the measurement. This operation also enables improved quality of the contact between the probe and the metallic strips.

Referring to FIG. 4b, the calibration device preferably comprises two, or a multiple of two, strips $J_1$, $J_2$ and $J'_1$, $J'_2$ which are arranged perpendicularly to the axes of alignment X'X and T'T, respectively, of the accesses of each series of patterns in order to mark the coverage of the accesses by the probes. Actually, tests have shown that the measurements change substantially, depending on whether the probes are arranged exactly relative to X'X and T'T or whether they more or less cover the accesses. It has been found notably that changes occur in the value of the phases of the diffusion parameters.

The strips can be arranged at the ends of the contact strips as shown in FIG. 4b, but can also be provided between the accesses. These elements are extremely important for obtaining a high precision and reproducibility of the measurements.

Referring to FIG. 4b, the calibration device comprising:
a line L;
reflective elements which are formed by the open lines $O_1$ and $O_2$;
matched elements which are formed by the load lines $M_1$ and $M_2$ matched by the resistances $R_1$ and $R_2$, relates to a calibration system according to the LRM standard. This standard corresponds to an extremely precise calculation algorithm which was not known for the microstrip technology thus far.

In order to realise the matching resistances $R_1$ and $R_2$, a strip of a resistive material is customarily formed. Preferably, the value of this resistance is very exactly trimmed, because tests have shown that the precision of the measurements in the LRM standard depends notably on the adjustment of these resistances $R_1$ and $R_2$. In order to adjust these resistances, first resistances which are a bit lower than desired are formed, followed by definition of a zone, by means of a mask as known from the integrated circuit technology, in which the thickness of the resistive layer is reduced, so that the resistance value increases. Very accurately trimmed resistances are thus obtained.

For better adjustment of the value of the resistances, the conventional resistances can be replaced by resistance-mounted active elements.

In the case where customary resistances are used, the geometry of these resistances is chosen so that the discontinuities with the lines whereto they are connected are minimized. To achieve this, for example the width of the resistance is chosen to be equal to the width e of the line.

Generally speaking, the width e of the lines could be chosen as a function of the thickness W of the substrate so as to form 50Ω or 75Ω lines. In that case the resistances $R_1$, $R_2$ could also be in the order of 50Ω or 75Ω, respectively. Such matching prevents the reflections, which is why it is so important for obtaining exact measurements.

Referring to the FIGS. 4a and 4b, in order to avoid the disturbances due to the discontinuities at the connections between the pads of vias and the lines, these pads (such as 22a, 22b in FIG. 2a) are provided so as to have a round shape or a geometry approximating a circular shape, for example a hexagonal shape, and preferably not a square shape as in the state of the art. It has been found that the measurements are optimized by this hexagonal or circular shape. However, other shapes of the pads are not precluded.

Figure 5:
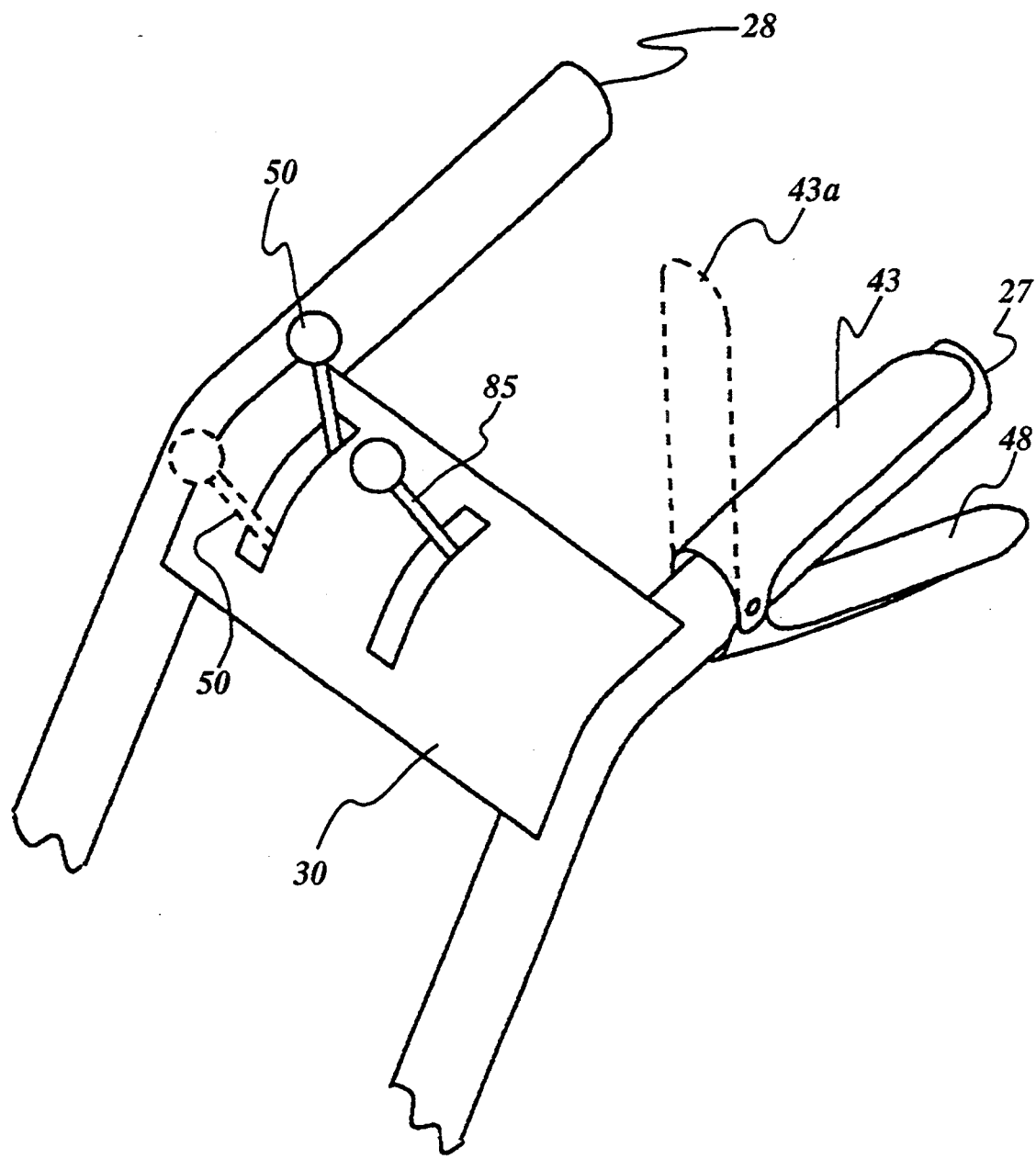
FIGS. 5a and 5b show measuring curves of the reflection and transmission coefficients obtained with calibration devices.
Figure 6:
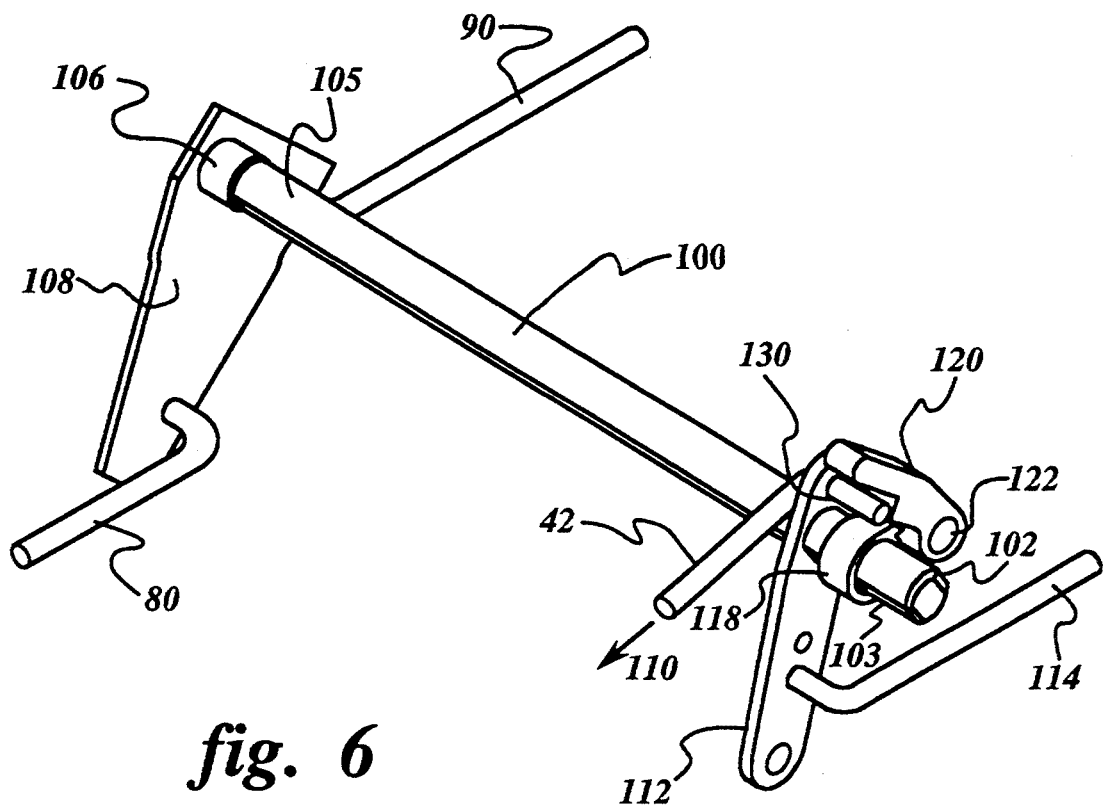
Figure 7:
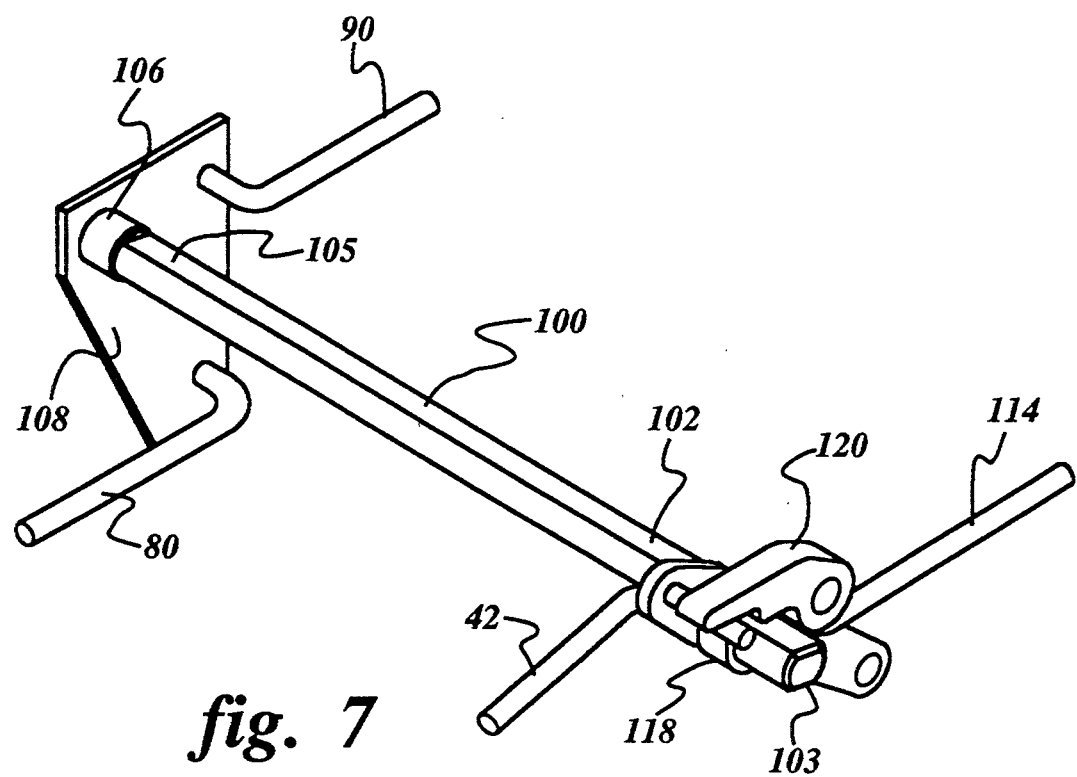
Figure 8:
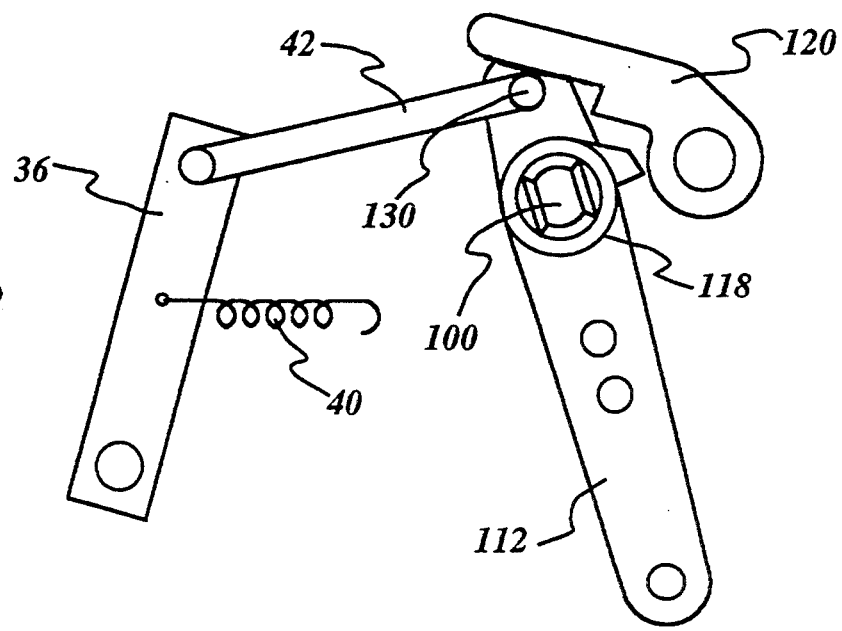
Figure 9:
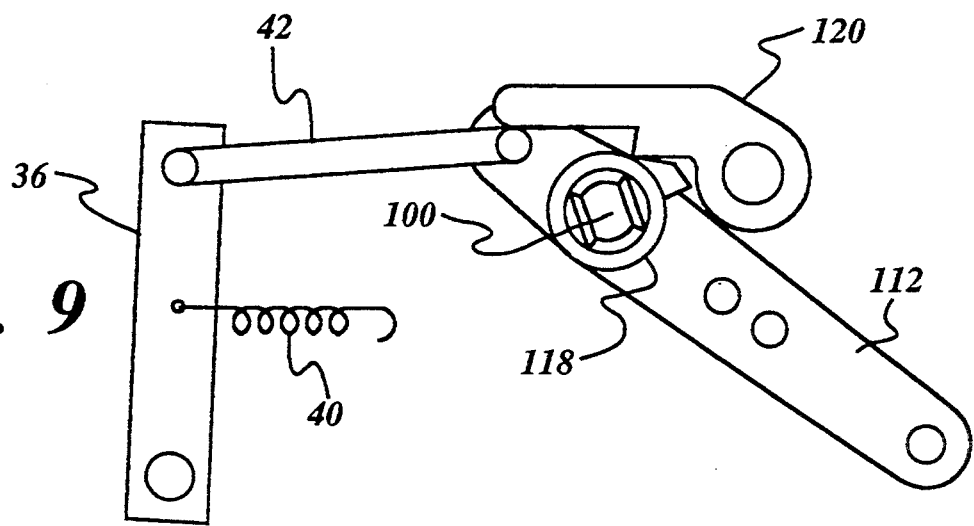
Figure 10:
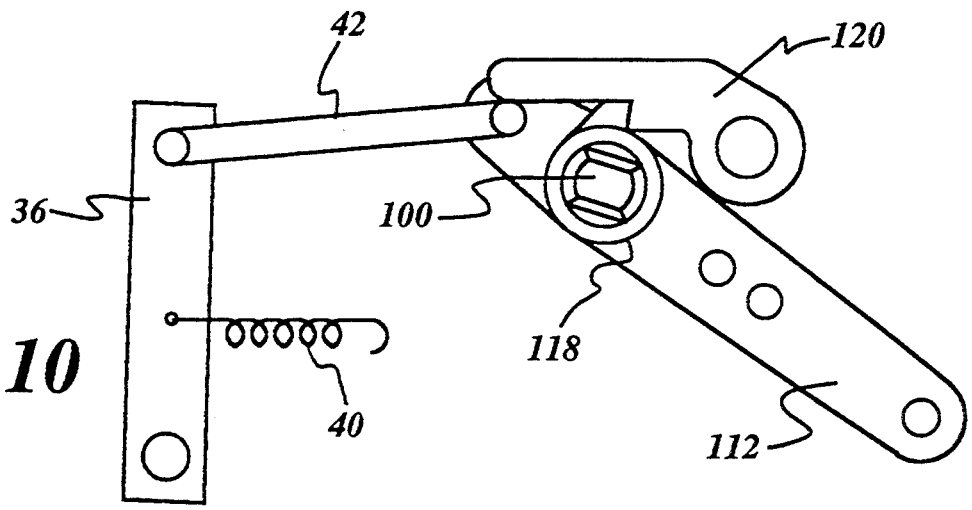
Figure 2:
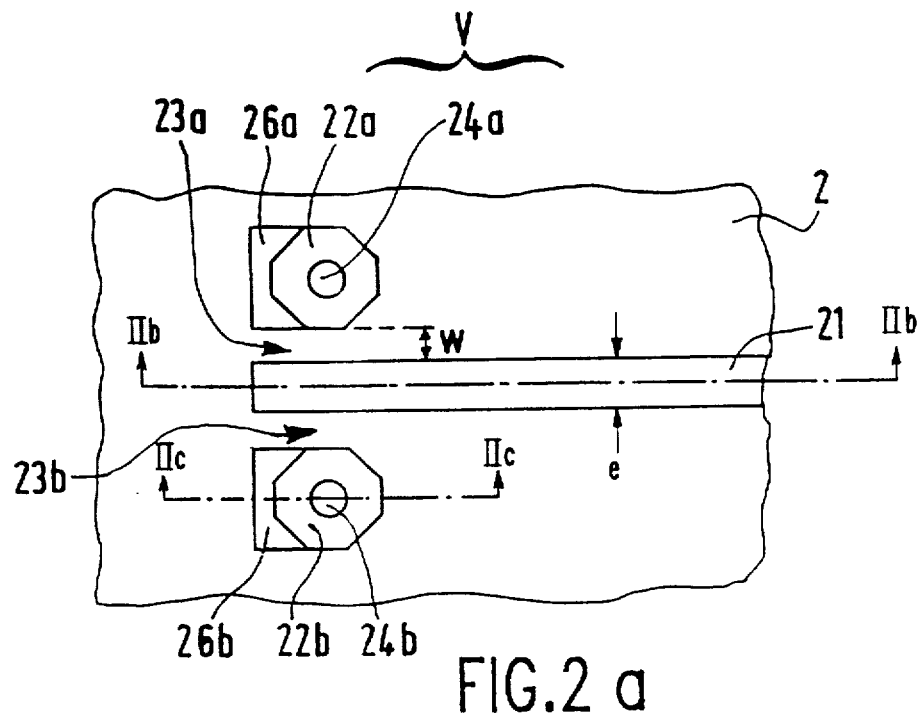
Figure 2:
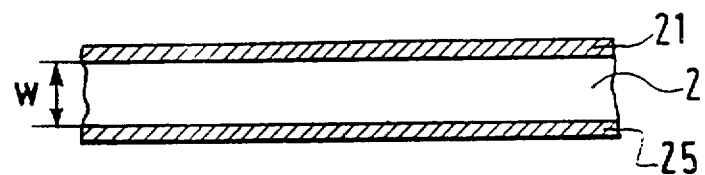
Figure 2:
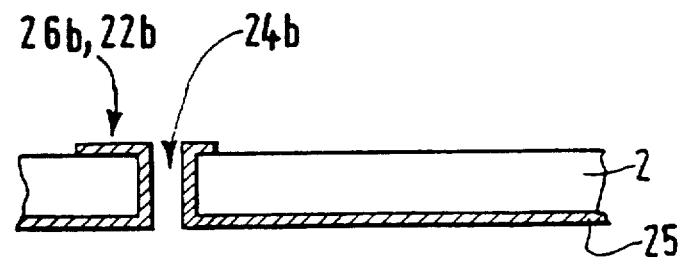

The curves in the FIGS. 5 represent the results that could be obtained in the case of a calibration system of the SOLT type (Short, Open, Load, Thru) and in the case of the calibration system of the LRM type (Load, Reflect, Match), the latter involving finely adjusted matching resistances (trimmed resistances).

Figure 5A:
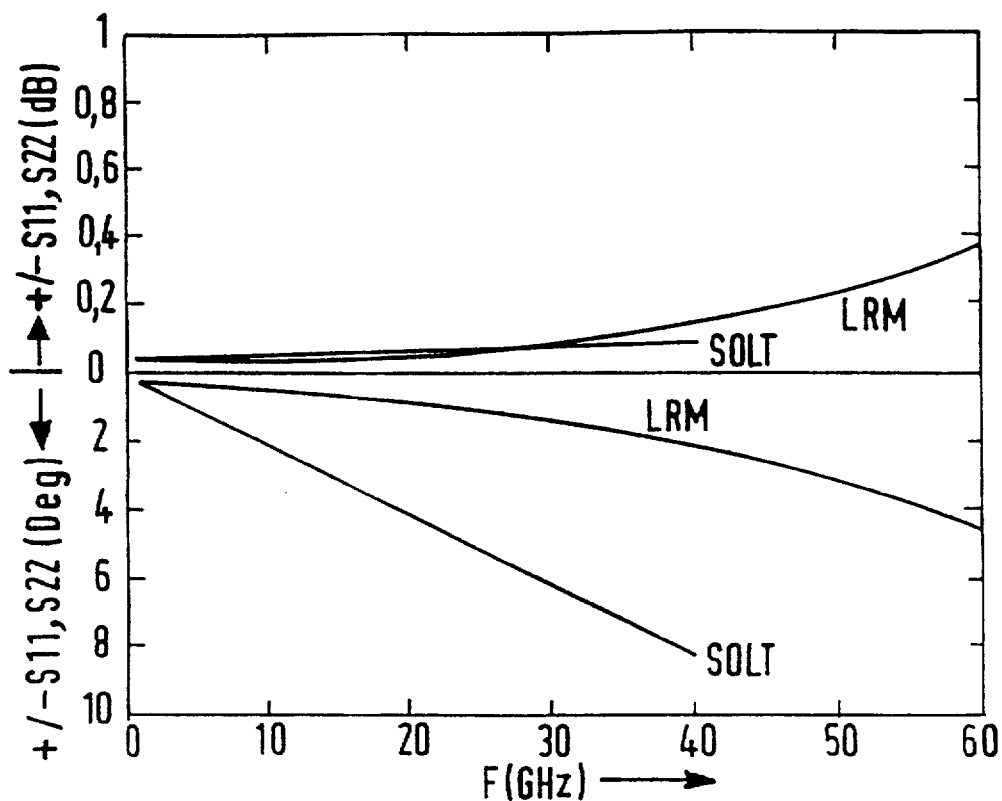

FIG. 5a shows on the one hand the amplitude responses (in dB) as a function of the frequency F (in GHz) and on the other hand the phase responses (in degrees) as a function of the frequency F (in GHz) corresponding to the dispersion coefficients $S_{11}$ and $S_{22}$. The curves LRM plotted versus the curves SOLT show that the LRM system offers results which are almost equivalent to the SOLT system, in respect of amplitude, in as far as the frequency remains below 40 GHz. These curves also show that the system LRM offers a better phase response in the same range of frequencies below 40 GHz. Beyond 40 GHz, that is to say between 40 and 60 GHz, the SOLT system does not offer results since it has reached its frequency limit, whereas the LRM system is not limited. Curves could be plotted up to 80 GHz for the LRM system.

Figure 5B:
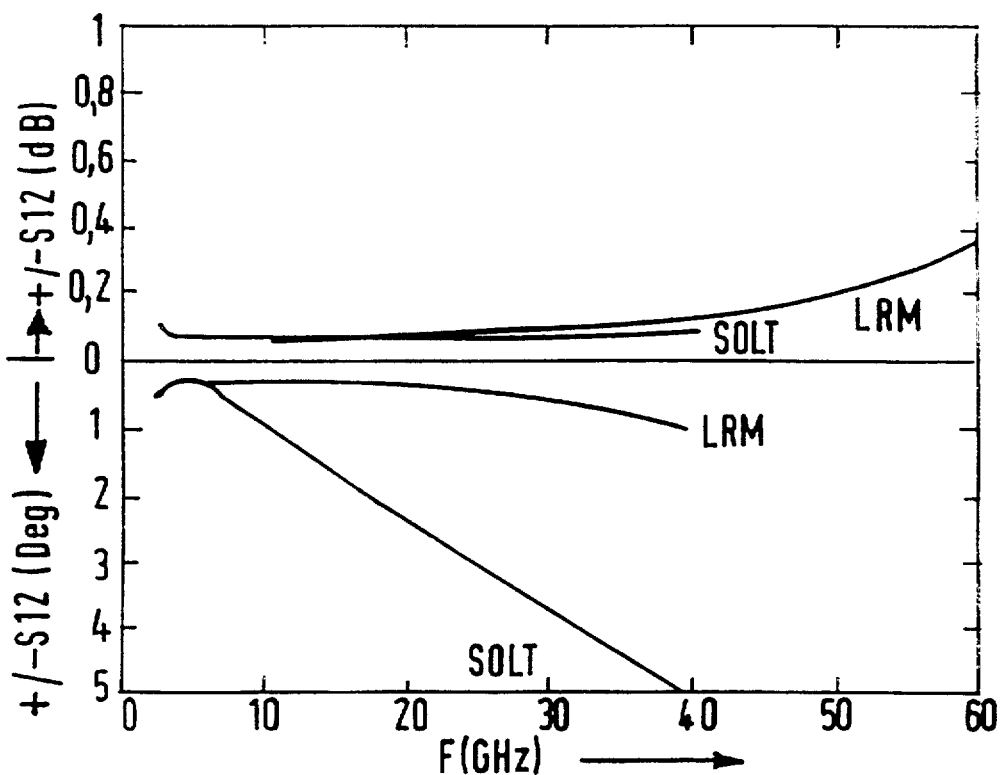

FIG. 5b shows on the one hand the amplitude responses (in dB) as a function of the frequency F (in GHz) and on the other hand the phase responses (in degrees) as a function of the frequency f (in GHz) corresponding to the dispersion coefficient $S_{12}$. The curves LRM versus the curves SOLT show that the LRM system again offers results which are approximately equivalent to the SOLT system, in as far as the amplitude is concerned, when the frequency remains below 40 GHz; however, the LRM system offers a much better phase response than the SOLT system in this frequency range. As has already been stated beyond 40 GHz only the LRM system is applicable.

The calibration structure in accordance with the invention, comprising two offset series of patterns and possibly a transmission line of a length such that its two accesses are aligned with those of the two series, said transmission line being also arranged, for example between the two series of patterns, is preferably realised using the microstrip technology for the reasons described above.

However, if necessary it could also be realised using the coplanar technology. To this end, it could suffice to replace the pads of the vias by ground conductors which would then be arranged between each line. The arrangement of offset series of patterns, with the transmission line of appropriate length to enable the measurements without displacement of the probes, can be completely carried out by means of the coplanar technology. This arrangement again involves the contact strips and the extended strips, accompanied by all described advantages.

However, in accordance with the invention it would be advantageous to realise the two offset series of patterns notably in order to bring the two reference planes nearer one another by minimizing the distance d.

However, if necessary one could very well maintain this arrangement of offset series of patterns while adopting a large distance d, for example a distance greater than three times the thickness of the substrate. The advantage of the availability of locations for the contact strips and the extended strips would then be maintained, which elements are important to the quality of the measurements.

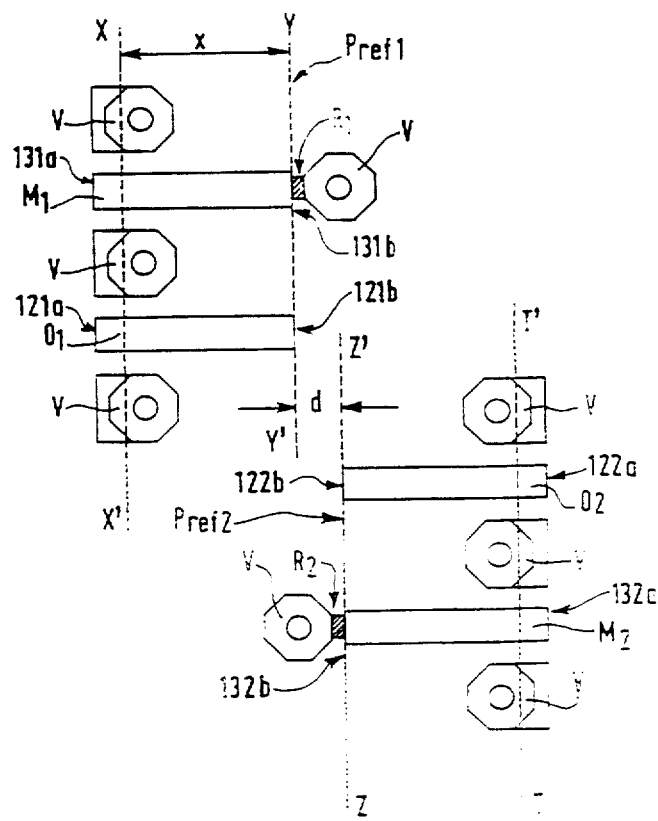

We claim:

1. A calibration structure for facilitating measurement, by contact with first and second test probes, of dispersion parameters of integrated circuit elements disposed on a substrate of predetermined thickness, said calibration structure also being disposed on said substrate and including:
   a. a first conductive pattern comprising a first group of mutually parallel transmission lines of a first predetermined length, each extending from a respective one of a first series of access locations, for contact with the first test probe, to a first reference plane for contact with a respective one of said integrated circuit elements, said first series of access locations being mutually aligned; and
   b. a second conductive pattern comprising a second group of mutually parallel transmission lines of said first predetermined length, each extending from a respective one of a second series of access location, for contact with the second test probe, to a second reference plane for contact with a respective one of said integrated circuit elements, said second series of access locations being mutually aligned;
   said first and second reference planes being mutually parallel and separated by a predetermined distance d which is no larger than approximately three times the thickness of the substrate; and
   said first and second groups of transmission lines being shifted relative to each other in the direction of said first and second reference planes such that said groups are separated by a distance at least equal to twice the thickness of the substrate.

2. A calibration structure as in claim 1 including a transmission line extending from a first access location which is aligned with said first series of access locations to a second access location which is aligned with said second series of access locations.

3. A calibration structure as in claim 2 where said transmission line is disposed between said first and second conductive patterns.

4. A calibration structure as in claim 1 comprising:
   a. a first conductive contact strip longitudinally aligned with the first series of access locations but extending across locations disposed opposite from at least a plurality of the second series of access locations; and
   b. a second conductive contact strip longitudinally aligned with the second series of access locations but extending across locations disposed opposite from at least a plurality of the first series of access locations.

5. A calibration structure as in claim 1 including means for determining coverage of the first and second test probes comprising:
   a. a first plurality of marking strips aligned with the first series of access locations but disposed at predetermined locations opposite from the second series of access locations; and
   b. a second plurality of marking strips aligned with the second series of access locations but disposed at predetermined locations opposite from the first series of access locations.

6. A calibration structure as in claim 4 including means for determining coverage of the first and second test probes comprising marking strips disposed adjacent opposite ends of each of said first and second contact strips.

7. A calibration structure as in claim 1 where each of the first and second groups of mutually parallel transmission lines includes:
   a. a first transmission line which is unterminated at the reference plane of the respective group; and
   b. a second transmission line which is terminated to ground through a matching impedance at the reference plane of the respective group.

8. A calibration structure as in claim 7 where:
   a. the first transmission line has a characteristic impedance of 50 ohms; and
   b. the second transmission line has a characteristic impedance of 50 ohms and the matching impedance has a resistance of 50 ohms.

9. A calibration structure as in claim 7 or 8 where said matching impedances are each dimensioned to minimize any discontinuity between the respective transmission line and ground.

10. A calibration structure as in claim 9 where each of said matching impedances and the respective transmission line terminated through said impedance have substantially identical widths.

11. A calibration structure as in claim 7 or 8 where each of said matching impedances comprises an active element.

12. A calibration structure as in claim 1, 2, 4, 5 or 7 where:
   a. the first and second conductive patterns comprise microstrip transmission lines; and
   b. each of said access locations comprises an end of a respective one of the transmission lines situated between first and second conductive pads surrounding respective plated-through holes in the substrate, said end and said first and second pads being spaced apart in conformance with spacings between respective contacts of the first and second test probes.

13. A calibration structure as in claim 1, 2, 4, 5 or 7 where the length of each of said transmission lines is at least equal to one-quarter wavelength at an operating frequency of the integrated circuit elements.

14. A calibration structure as in claim 1, 2, 4, 5 or 7 where at least one of the integrated circuit elements has a first test point which is electrically connected to one of the first series of access locations and has a second test point which is electrically connected to one of the second series of access locations, said test points being separated by the distance d.

15. A calibration structure as in claim 14 where the first and second test points substantially coincide with the first and second reference planes, respectively.

16. A method for measuring, by contacting a calibration structure with first and second test probes, dispersion parameters of integrated circuit elements disposed on a substrate of predetermined thickness, said calibration structure also being disposed on said substrate and including:
   a. a first conductive pattern comprising a first group of mutually parallel transmission lines of a first predetermined length, each extending from a respective one of a first series of access locations, for contact with the first test probe, to a first reference plane for contact with a respective one of said integrated circuit elements, said first series of access locations being mutually aligned;
   b. a second conductive pattern comprising a second group of mutually parallel transmission lines of said first predetermined length, each extending from a respective one of a second series of access location, for contact with the second test probe, to a second reference plane for contact with a respective one of said integrated circuit elements, said second series of access locations being mutually aligned;
   c. a first conductive contact strip longitudinally aligned with the first series of access locations but extending across a locations disposed opposite from one of the second series of access locations; and
   d. a second conductive contact strip longitudinally aligned with the second series of access locations but extending across a location disposed opposite from one of the first series of access locations;
   said first and second reference planes being mutually parallel and separated by a predetermined distance d which is no larger than approximately three times the thickness of the substrate; and
   said first and second groups of transmission lines being shifted relative to each other in the direction of said first and second reference planes such that said groups are separated by a distance at least equal to twice the thickness of the substrate;
   said method comprising the steps of:
   (1) contacting the first conductive contact strip with the first test probe to short circuit electrical contacts of said first test probe while contacting the opposite one of the second series of access locations with the second test probe; and
   (2) contacting the second conductive contact strip with the second test probe to short circuit electrical contacts of said second test probe while contacting the opposite one of the first series of access locations with the first test probe.

17. A method as in claim 16 where the calibration structure includes a transmission line extending from a first access location which is aligned with said first series of access locations to a second access location which is aligned with said second series of access locations, said method including the step of contacting the first access location with the first test probe while contacting the second access location with the second test probe.

18. A method as in claim 16 or 17 where the first and second test probes are maintained at a constant mutual separation while performing said steps.

* * * * *

UNITED STATES PATENT AND TRADEMARK OFFICE
CERTIFICATE OF CORRECTION

PATENT NO. : 5,434,502

DATED : July 18, 1995

INVENTOR(S) : Peter C. Walters, et. al.

It is certified that error appears in the above-identified patent and that said Letters Patent is hereby corrected as shown below:

Title page, showing an illustrative figure should be deleted and substitute therefor the attached title page.

Drawings:

Delete Drawing sheets Figs. 1a, 2c, 3, 4a, 4b and 5b and substitute therefor the Drawing sheets, consisting of Figs. 1a, 2c, 3, 4a 4b and 5b.

Signed and Sealed this

Eighteenth Day of June, 1996

*Attest:*

BRUCE LEHMAN

*Attesting Officer*   *Commissioner of Patents and Trademarks*

United States Patent [19]

Walters et al.

[11] Patent Number: 5,434,502

[45] Date of Patent: Jul. 18, 1995

[54] CALIBRATION DEVICE FOR HYPER-FREQUENCY ADJUSTMENT OF THE REFERENCE PLANES OF AN APPARATUS FOR MEASURING THE DISPERSION PARAMETERS OF ELEMENTS OF INTEGRATED CIRCUITS

[75] Inventors: Peter C. Walters, Bowen Island, Canada; Patrice Gamand, Yerres, France

[73] Assignee: U.S. Philips Corporation, New York, N.Y.

[21] Appl. No.: 124,742

[22] Filed: Sep. 21, 1993

[30] Foreign Application Priority Data

Sep. 23, 1992 [FR] France .................. 92 11332

[51] Int. Cl.$^6$ ............... G01R 35/00; G01R 31/02
[52] U.S. Cl. ................................. 324/158.1; 324/754
[58] Field of Search ............... 324/158 R, 716, 158.1, 324/74, 95, 754, 763

[56] References Cited

U.S. PATENT DOCUMENTS

| 4,144,493 | 3/1979 | Lee et al. | 324/158 R |
| 4,347,479 | 8/1982 | Cullet | 324/716 |
| 5,247,262 | 9/1993 | Cresswell et al. | 324/716 |

FOREIGN PATENT DOCUMENTS 3243871  2/1990  Japan .

Primary Examiner—Ernest F. Karlsen
Attorney, Agent, or Firm—Robert J. Kraus

[57] ABSTRACT

A calibration device is disclosed for hyper-frequency adjustment of the reference planes of an apparatus for measuring the dispersion parameters of elements of circuits integrated on a substrate. The device includes, integrated on the same substrate, standard patterns and accesses to these patterns which are compatible with the contacts of two test probes connected to the apparatus. Also provided on the substrate are at least two identical series of standard patterns which are formed by parallel lines of the same length, including a short-circuit line and/or an open line and/or a load line, whose accesses are aligned within each series, but opposed from one series to another with respect to the zone in which the second ends are situated. Their second ends are aligned within each series, defining the facing reference planes, separated by a given distance d. The second ends are also arranged in an offset manner from one series to the other in the plane of the substrate by translations parallel to the reference planes so that the distance between these offset ends is equal to or greater than twice the thickness of the substrate and the distance d separating the reference planes is approximately equal to or smaller than three times the thickness of the substrate.

18 Claims, 7 Drawing Sheets